United States Patent
Sato et al.

(10) Patent No.: US 7,522,660 B2
(45) Date of Patent: Apr. 21, 2009

(54) PULSE PATTERN GENERATING APPARATUS

(75) Inventors: Chie Sato, Musashino (JP); Shinji Kobayashi, Musashino (JP); Hirotoshi Kodaka, Musashino (JP); Ikurou Aoki, Musashino (JP); Kousuke Doi, Musashino (JP); Akira Toyama, Musashino (JP); Morio Wada, Musashino (JP); Hiroyuki Matsuura, Musashino (JP); Hiroshi Sugawara, Musashino (JP); Masamichi Ohashi, Musashino (JP); Hironori Okita, Musashino (JP); Yasukazu Akasaka, Musashino (JP); Tsuyoshi Yakihara, Musashino (JP); Akira Miura, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 657 days.

(21) Appl. No.: 10/897,073

(22) Filed: Jul. 23, 2004

(65) Prior Publication Data
US 2005/0058190 A1 Mar. 17, 2005

(30) Foreign Application Priority Data
Sep. 16, 2003 (JP) ............................. 2003-322383

(51) Int. Cl.
H04B 3/46 (2006.01)

(52) U.S. Cl. ...................... 375/224; 702/124
(58) Field of Classification Search ................. 370/252; 375/224, 230; 345/340; 714/704; 702/124
See application file for complete search history.

(56) References Cited

U.S. PATENT DOCUMENTS

| 3,845,390 | A | * | 10/1974 | De Jager et al. | 375/231 |
| 3,868,576 | A | * | 2/1975 | Bagdasarjanz et al. | 375/230 |
| 5,001,619 | A | * | 3/1991 | Nakajima et al. | 363/41 |
| 5,391,933 | A | * | 2/1995 | Rein | 327/108 |
| 5,583,892 | A | * | 12/1996 | Drakul et al. | 375/353 |
| 5,715,363 | A | * | 2/1998 | Tamura et al. | 704/205 |
| 6,430,235 | B1 | * | 8/2002 | O'Shea et al. | 375/326 |
| 2003/0063662 | A1 | * | 4/2003 | Uchino et al. | 375/226 |
| 2003/0112241 | A1 | * | 6/2003 | Fernando | 345/440 |
| 2006/0200708 | A1 | * | 9/2006 | Gentieu et al. | 714/704 |

FOREIGN PATENT DOCUMENTS

| JP | 8-331102 | 12/1996 |
| JP | 2001-144819 | 5/2001 |

* cited by examiner

*Primary Examiner*—David C Payne
*Assistant Examiner*—Leon-Viet Q Nguyen
(74) *Attorney, Agent, or Firm*—Westerman, Hattori, Daniels & Adrian, LLP.

(57) ABSTRACT

An object of this invention is to realize a pulse pattern generating apparatus that outputs a test signal of high waveform quality even when the shape of an eye pattern is changed. This invention is an improvement of a pulse pattern generating apparatus that generates a test signal of a predetermined pattern by using plural digital-analog converters and outputs the test signal to a test subject. The apparatus includes: a parameter setting unit for setting values of plural parameters that determine the shape of an eye pattern of the test signal; a storage unit for storing output values to the digital-analog converters corresponding to the values of the parameters; an arithmetic operation unit for calculating output values to the digital-analog converters from the values of the parameters from the parameter setting unit and the output values in the storage unit; and a voltage value setting unit for setting, for the digital-analog converters, voltage values to be outputted from the digital-analog converters on the basis of the result of calculation by the arithmetic operation unit.

6 Claims, 7 Drawing Sheets

PULSE PATTERN GENERATING APPARATUS

BACKGROUND OF THE INVENTION

1. Field of the Invention

This invention relates to a pulse pattern generating apparatus that generates a test signal of a predetermined pattern for measuring the waveform quality of a digital signal by using plural digital-analog converters and then outputting the generated signal to a test subject, and particularly to a pulse pattern generating apparatus that outputs a test signal of high waveform quality even if the shape of an eye pattern is changed.

2. Description of the Related Art

When a digital signal using an electric signal or an optical signal is transmitted through a transmission line or inputted to a device, which is a test subject, the waveform quality of the digital signal is deteriorated by the characteristics of the test subject. The deterioration in the waveform quality causes increase in the bit error rate, increase of jitter, variance of the amplitude of waveform, change in the shape of an eye pattern and the like. Generally, for testing the deterioration in the waveform quality, a test signal is inputted to a test subject and an output signal outputted from the test subject is received. Then, the received signal and the test signal are compared with each other to measure the bit error rate (see, for example, JP-A-8-331102 (paragraph nos.0002-0008, FIGS. 3 and 4)) or to measure an eye pattern (see, for example, JP-A-2001-144819 (paragraph nos.0002-0008, FIG. 8)). The test is thus performed.

Therefore, the test signal needs to have high waveform quality (i.e., less jitter, less variance in amplitude, less noise, less overshoot/undershoot, high opening rate of the eye pattern and the like).

FIG. 1 shows the structure of a conventional pulse pattern generating apparatus.

FIG. 2 shows an eye pattern (with a cross point of 50%) of a test signal outputted from the apparatus shown in FIG. 1.

In FIG. 1, a voltage value setting unit 10 has a pattern generator circuit 11 and sets a voltage value for causing a signal outputted from the pattern generator circuit 11 to have an eye pattern of a predetermined shape. The pattern generator circuit 11 outputs an M-sequence pseudo-random pulse pattern (hereinafter simply referred to as pulse pattern) signal.

A waveform generator unit 20 has digital-analog converters (hereinafter simply referred to as DA converters) 21 to 24, an amplifier 25, an upper limit clipping circuit 26 and a lower limit clipping circuit 27. The waveform generator unit 20 generates and outputs a pulse pattern signal having an eye pattern of a desired shape in accordance with the setting from the voltage value setting unit 10. The pulse pattern signal outputted from the waveform generator unit 20 is a test signal of the predetermined pattern.

The DA converters 21 to 24 output voltage values set in accordance with the setting from the voltage value setting unit 10. The amplifier 25 amplifies the pulse pattern signal from the pattern generator circuit 11 in accordance with the output from the DA converter 21, and the outputs the amplified pulse pattern signal. The upper limit clipping circuit 26 includes, for example, a diode, a resistor, a capacitor and the like. The upper limit clipping circuit 26 clips the pulse pattern signal outputted from the amplifier 25 and offset by the output from the DA converter 22, at an upper limit value of a certain constant level in accordance with the output from the DA converter 23, and outputs the clipped pulse pattern signal. The lower limit clipping circuit 27 includes, for example, a diode, a resistor, a capacitor and the like. The lower limit clipping circuit 27 clips the pulse pattern signal outputted from the upper limit clipping circuit 26, at a lower limit value of a certain constant value in accordance with the output from the DA converter 24.

The operation of this apparatus will now be described.

The pulse pattern generator circuit 11 of the voltage value setting unit 10 outputs a pulse pattern signal of small amplitude to the amplifier 25. The voltage value setting unit 10 sets the voltage values of the DA converters 21 to 24 synchronously with the pulse pattern signal from the pulse pattern generator circuit 11. The DA converters 21 to 24 outputs the voltage values thus set.

Then, the amplifier 25 amplifies the pulse pattern signal of small amplitude to desired amplitude at an amplification factor corresponding to the voltage value outputted from the DA converter 21. The pulse pattern signal is amplified to amplitude that is sufficiently larger than the amplitude of the pulse pattern signal outputted from the lower limit clipping circuit 27.

The amplified pulse pattern signal is offset by the voltage value outputted from the DA converter 22 and inputted to the upper limit clipping circuit 26. For example, because of the offset from the DA converter 22, the lower limit value used for clipping by the lower value clipping circuit 27 becomes 1 [V].

Moreover, the upper limit clipping circuit 26 performs clipping at an upper limit value of a level corresponding to the voltage value outputted from the DA converter 23, for example, at a level slightly lower than a high level. Specifically, the level is determined as the output from the DA converter 23 is added as a bias voltage of a diode, not shown, of the upper limit clipping circuit 26. Then, the clipped pulse pattern signal is outputted to the lower value clipping circuit 27. Since the voltage of the level at which clipping is performed is changed by the bias voltage to the diode, the voltage value of the level at which clipping is performed and the voltage value outputted from the DA converter 23 have a nonlinear relation.

Then, the lower limit clipping circuit 27 performs clipping at a lower limit value of a level corresponding to the voltage value outputted from the DA converter 24. For example, it performs clipping at a position where the cross point of the eye pattern is 50% as shown in FIG. 2. Then, the pulse pattern signal shown in FIG. 2, which has the new levels at which clipping is performed by the clipping circuits 26 and 27, as its high and low levels, is outputted to a test subject, not shown. Of course, the level difference between the new high and low levels is the amplitude. Although the pulse pattern signal outputted from the pattern generator circuit 11 has overshoot and undershoot, these are eliminated by the clipping circuits 26 and 27. In this manner, the pulse pattern signal of high waveform quality is outputted. The offset in FIG. 2 is not the voltage value outputted from the DA converter 22 but is the level difference between the level of 0 [V] and an intermediate level between the low and high levels.

The apparatus shown in FIG. 1 as described above outputs a test signal of high waveform quality by setting the voltage values of the plural DA converters 21 to 24 in accordance with the pulse pattern signal. In this apparatus, the cross point and amplitude, which are parameters to determine the shape of the eye pattern, have fixed values. This is because the voltage values of the DA converters 21 to 24 are closely related with the shape of the eye pattern and cannot be set easily.

For example, the case of changing the value of the cross point from 50% to 30% while the amplitude remains unchanged will now be described with reference to FIGS. 3A to 3C. FIGS. 3A to 3C show the eye patterns of the pulse pattern signal. FIG. 3A shows the eye pattern of the pulse pattern signal outputted form the amplifier 25. FIG. 3B shows the eye pattern of the pulse pattern signal with the cross point of 50%. FIG. 3C shows the eye pattern of the pulse pattern signal outputted from the amplifier 25 (having a larger amplification factor than in FIG. 3A).

First, when the cross point is 50%, as described above, clipping is performed at level L1 of the upper limit value and at level L2 of the lower limit value as shown in FIG. 3A. Thus, a pulse pattern signal having the eye pattern with the amplitude shown in FIG. 3B and the cross point of 50% is generated.

On the other hand, in the case of changing the cross point to 30%, if level L2 of the lower limit value shown in FIG. 3A is simply raised, the amplitude changes. Moreover, the changed level and level L2 are different levels. Thus, the setting of the voltage value of the DA converter 21 is first changed and the amplification factor of the amplifier 25 is increased to generate a pulse pattern signal having the eye pattern shown in FIG. 3C. Then, the setting of the voltage values of the DA converters 23 and 24 is changed and clipping is performed at level L3 of the upper limit value and at level L4 of the lower limit value. Thus, a pulse pattern signal having the same amplitude as in FIG. 3B and a different cross point is generated. Of course, to equalize level L2 and level L4 of the lower limit value, the voltage value of the DA converter 22 is set and the quantity of offset is changed.

Similarly, in the case of changing the amplitude alone, it is necessary to not only change the setting of the voltage value of the DA converter 21, which determined the amplification factor of the amplifier 25, but also change the setting of the voltage values of the DA converters 22 to 24. Since the shape of the eye pattern is closely related with the voltage values set in the DA converters 21 to 24, the parameter values are generally fixed.

However, while users strongly want to input a pulse pattern signal having large amplitude or change the cross point depending on the test subject, there is a problem that the fixed shape of the eye pattern limits the subjects that can be tested. If a user personally changes the shape of the eye pattern, it is difficult to optimally set the voltage values of all the DA converters 21 to 24 and a pulse pattern signal of poor waveform quality is outputted. This causes a problem that the test cannot be carried out accurately. Particularly when the transmission rate of the pulse pattern signal is very high, for example, higher than 10 [Gbps], it is difficult to set the voltage values of the DA converters 21 to 24.

SUMMARY OF THE INVENTION

It is an object of this invention to realize a pulse pattern generating apparatus that outputs a test signal having high waveform quality even when the shape of the eye pattern is changed.

DETAILED DESCRIPTION OF THE PREFERRED EMBODIMENTS

Embodiments of this invention will now be described with reference to the drawings.

Figure 1:
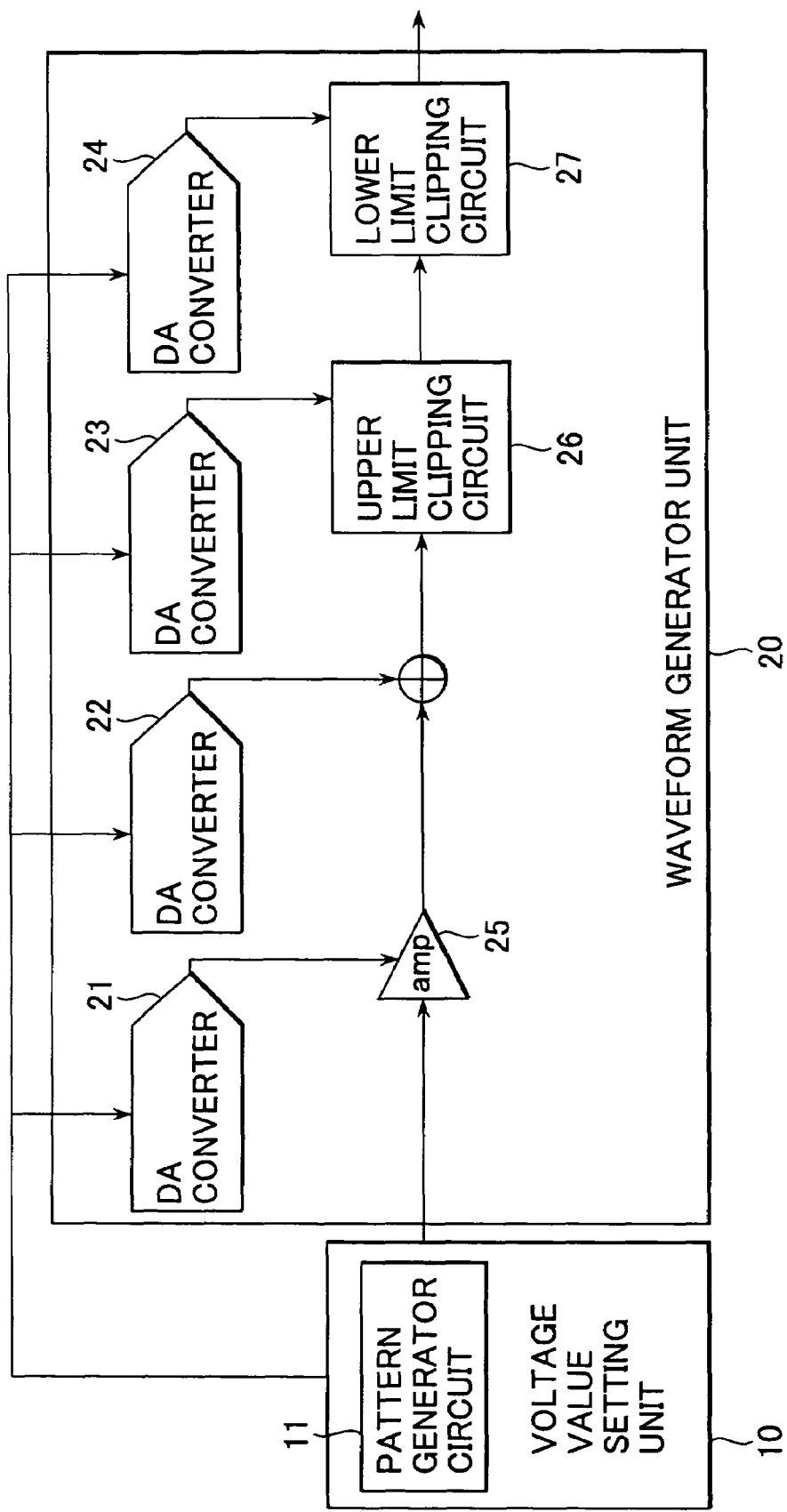
FIG. 1 is a structure view of a conventional pulse pattern generating apparatus.
Figure 4:
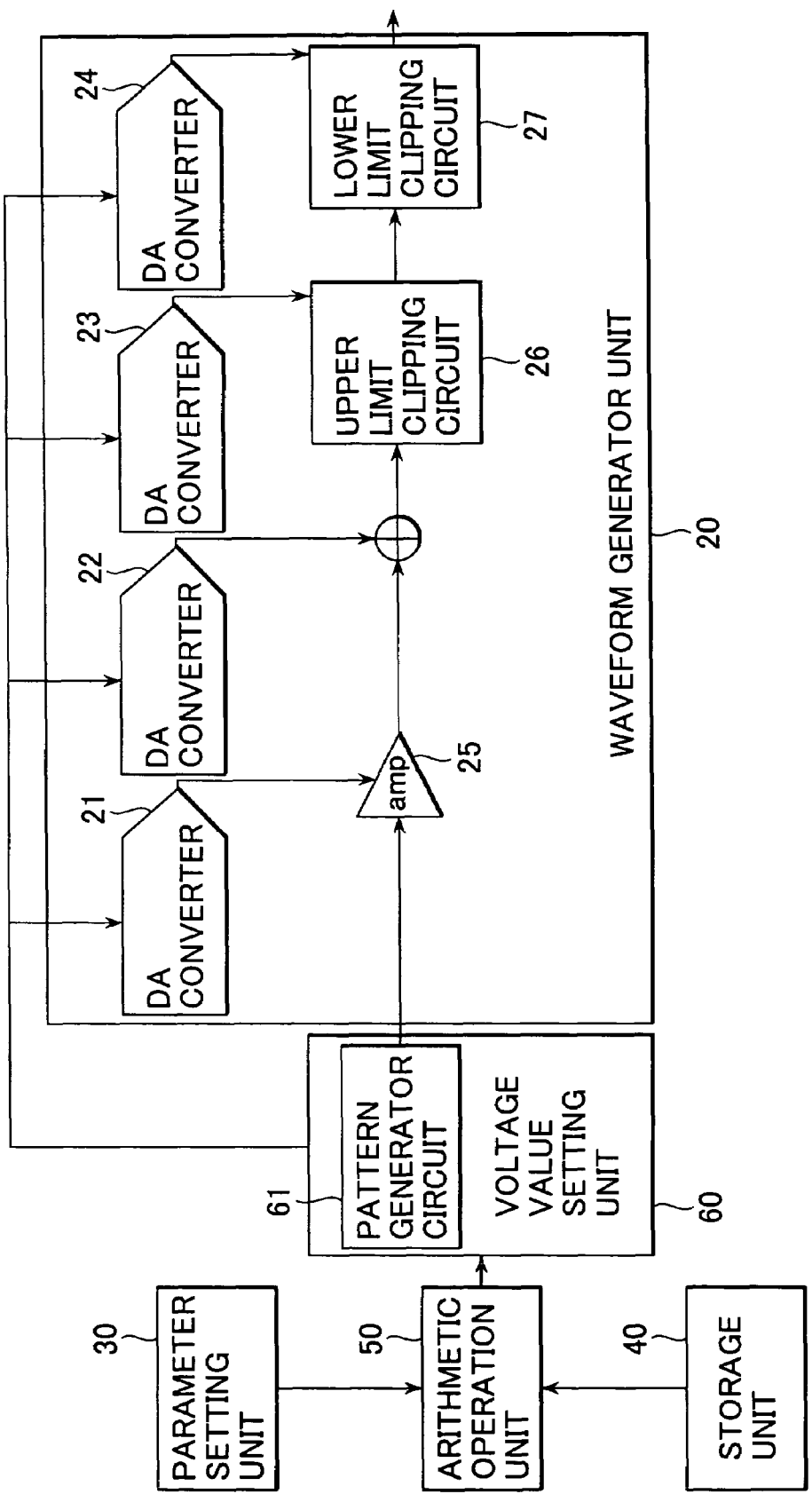
FIG. 4 is a structural view showing a first embodiment of this invention.

FIG. 4 is a structural view showing an embodiment of this invention. The same elements as in FIG. 1 are denoted by the same numerals and will not be described further in detail. In FIG. 4, a parameter setting unit 30 is additionally provided. It sets values of plural parameters (cross point and amplitude) that determine the shape of an eye pattern.

Also a storage unit 40 is additionally provided. It stores an output value to the DA converter 21 of the waveform generator circuit 20 corresponding to the parameter values, that is, characteristics of the parameter values and output values, within the setting ranges of the parameter values (for example, the setting range of the cross point is 30 to 70% and the setting range of the amplitude is 1 to 5 [V]).

Also an arithmetic operation unit 50 is additionally provided. It calculates output values to the DA converters 21 to 24 of the waveform generator unit 20 from the parameter values set by the parameter setting unit 30 and the output value in the storage unit 40.

A voltage value setting unit 60 is provided instead of the above-described voltage value setting unit 10. The voltage value setting unit 60 has a pattern generator circuit 61 similar to the pattern generator circuit 11, and sets voltage values to be outputted from the DA converters 21 to 24, for the DA converters 21 to 24 of the waveform generator unit 20 on the basis of the result of calculation from the arithmetic operation unit 50. The pattern generator circuit 61 outputs a signal of a very high transmission rate, for example, a pulse pattern signal of higher than 10 [Gbps].

The operation of this apparatus will now be described.

First, the characteristics of the parameter values and output value are stored in advance into the storage unit 40. For example, this is done at the time of manufacturing the apparatus shown in FIG. 4 or at the time of maintenance. This storage operation will be described first. An oscilloscope, not shown, is connected to the output side of the waveform generator unit 20, and a pulse pattern signal outputted from the waveform generator unit 20 is measured by the oscilloscope. In this case, sweep is triggered by a clock component of the pulse pattern signal, and a waveform changing from the low level to the high level, a waveform changing from the high level to the low level, a waveform keeping the low level, and a waveform keeping the high level are superimposed to display an eye pattern.

Then, if the setting range of the cross point is 30 to 70% and the setting range of the amplitude is 1 to 5 [V], while the eye pattern displayed on the oscilloscope is observed, output values to the DA converters 21 to 24 corresponding to individual parameter values are calculated with the cross point changed by 5% each and the amplitude changed by 0.5 [V] each. The calculated output values are stored into the storage unit 40.

Specifically, while the eye pattern displayed on the oscilloscope is observed, voltage values to be outputted from the DA converters 21 to 24 are adjusted so that the eye pattern has amplitude of 1 [V] and a cross point of 30%. The values set in the DA converters 21 to 24 at this point are stored into the storage unit 40 as output values corresponding to the amplitude of 1 [V] and the cross point of 30%.

Then, the voltage values to be outputted from the DA converters 21 to 24 are adjusted so that the eye pattern has amplitude of 1.5 [V] and a cross point of 30%. The values set in the DA converters 21 to 24 at this point are stored into the storage unit 40 as output values corresponding to the amplitude of 1.5 [V] and the cross point of 30%.

Similarly, the characteristics of output values corresponding to combinations of the values of the amplitude and the values of the cross point (81 combinations in total) are stored into the storage unit 40.

Figure 5A:
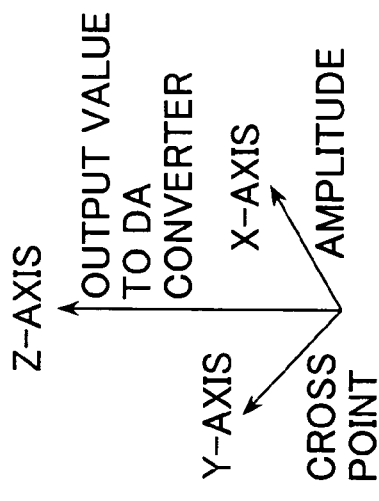
FIGS. 5A and 5B are views showing exemplary characteristics stored in a storage unit 40.
Figure 5B:
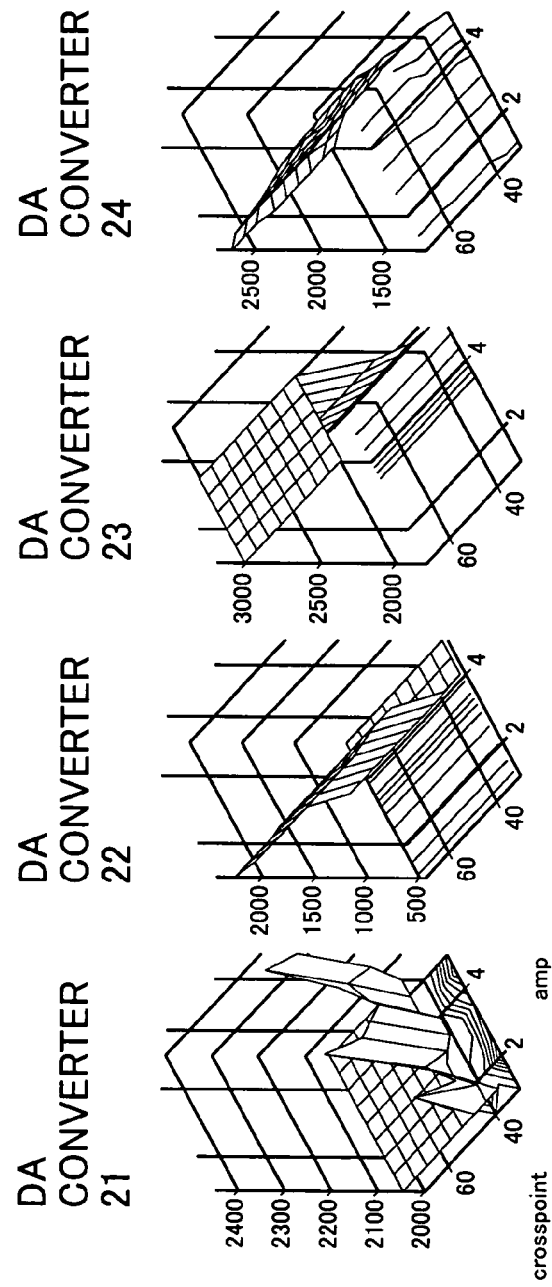

FIGS. 5A and 5B are views showing characteristics stored into the storage unit 40. FIG. 5A is an explanatory view of each axis. FIG. 5B is a view showing characteristics of each of the DA converters 21 to 24. In FIGS. 5A and 5B, the X-axis represents amplitude, the Y-axis represents cross point, and the Z-axis represents the output value to the DA converters 21 to 24. Of course, the value on the Z-axis and the voltage value outputted from each of the DA converters 21 to 24 correspond to each other in a one-to-one correspondence. For example, when the value on the Z-axis is 2000, the DA converter 21 outputs a voltage value of 2 [V]. When the value on the Z-axis is 2200, the DA converter 21 outputs a voltage value of 2.2 [V].

Now, the operation of generating a pulse pattern signal for measuring the waveform quality of a digital signal by using the plural DA converters 21 to 24 and outputting the generated pulse pattern signal to a test subject will be described.

Figure 6:
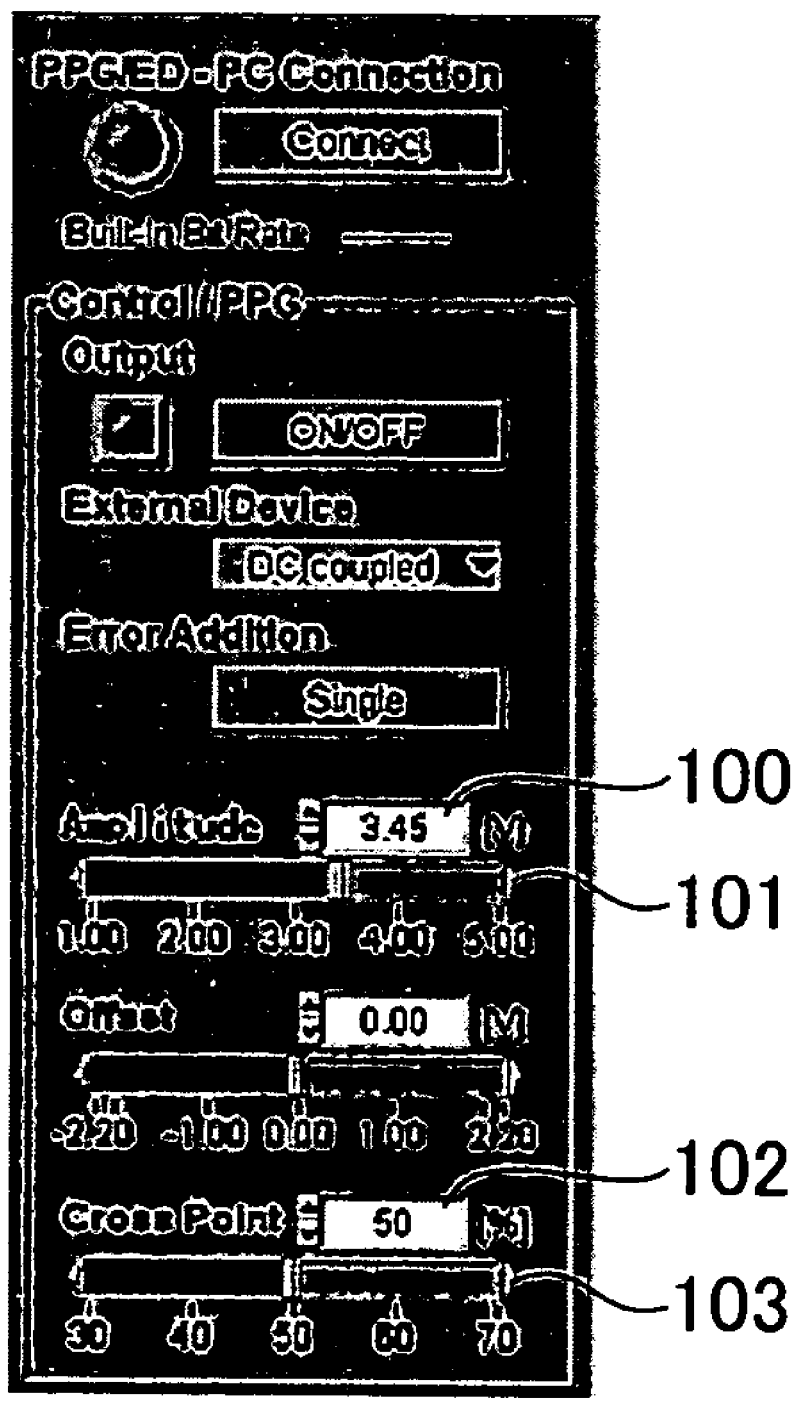
FIG. 6 is a view showing an exemplary screen display for setting parameters.

The parameter setting unit 30 displays a screen shown in FIG. 6 on a display unit (for example, CRT or liquid crystal display), not shown. In FIG. 6, the amplitude is set by using either a text box 100 or a scroll bar 101, and the cross point is set by using either a text box 102 or a scroll bar 103. The values of the amplitude and cross point may be displayed in such a manner that the user can only set the values within the setting ranges stored in the storage unit 40.

Then, the user sets the value of the amplitude and the value of the cross point (for example, amplitude of 3.45 [V] and cross point of 50%) via a user interface, not shown. The parameter setting unit 30 reads the parameter values set by the user and outputs these values to the arithmetic operation unit 50.

The arithmetic operation unit 50 thus calculates the output values to the DA converters 21 to 24 from the storage unit 40. For example, according to FIG. 5B, the output value to the DA converter 21 is 2040. Since the storage unit 40 stores the output values corresponding to an amplitude value of every 0.5 [V] and a cross point value of every 5%, if corresponding amplitude and cross point are not found, the arithmetic operation unit 50 performs linear interpolation or curved interpolation from values close to the preset values (for example, amplitude values of 3 [V] and 3.5 [V]) and thus calculates the output values.

Then, the arithmetic operation unit 50 outputs the result of the calculation to the voltage value setting unit 60. The pulse pattern generator circuit 61 of the voltage value setting unit 60 outputs a pulse pattern signal of small amplitude to the amplifier 25. From the output values as the result of the calculation, the voltage value setting unit 60 sets voltage values to be outputted from the DA converters 21 to 24, for each of the DA converters 21 to 24. The voltage value setting unit 60 may output the voltage values to the DA converters 21 to 24 synchronously with the pulse pattern signal from the pulse pattern generator circuit 61. The DA converters 21 to 24 thus output the preset voltage values, respectively.

Figure 2:
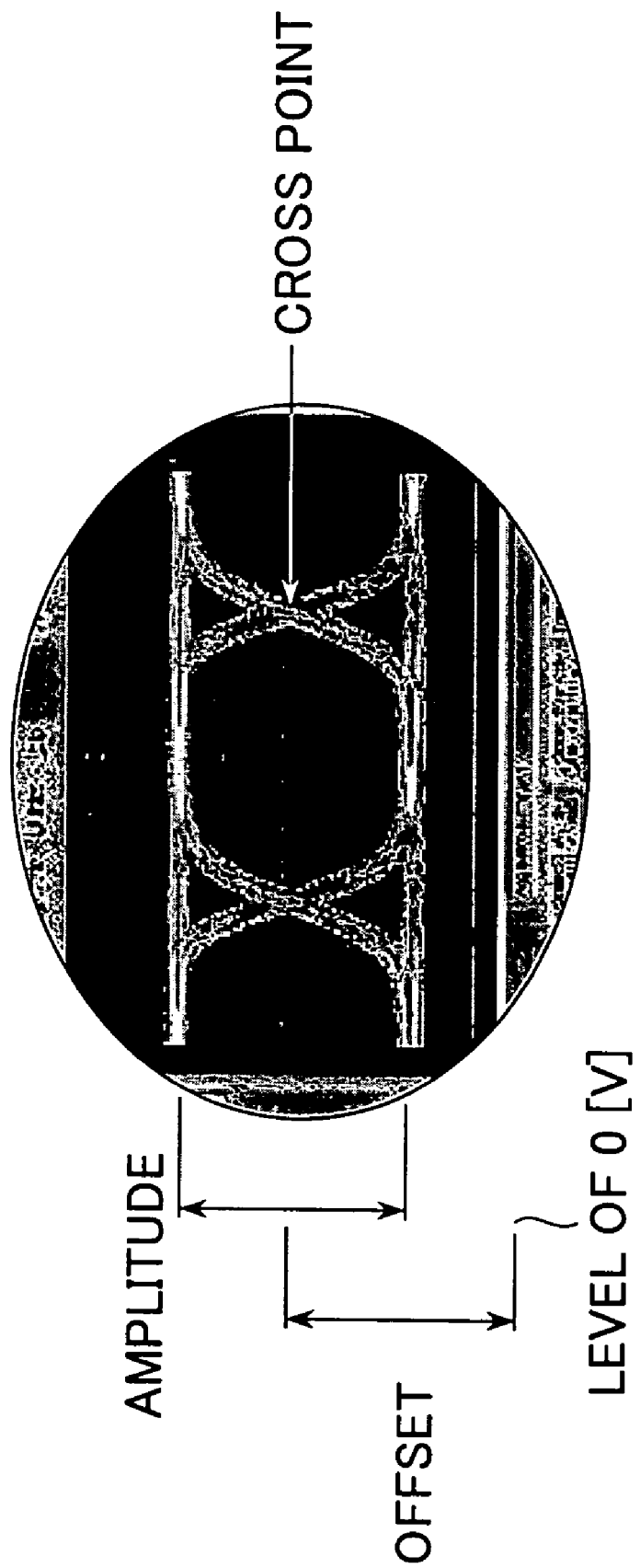
FIG. 2 is a view showing an eye pattern (with a fixed parameter) of a pulse pattern signal outputted from the apparatus shown in FIG. 1.
Figure 3A:
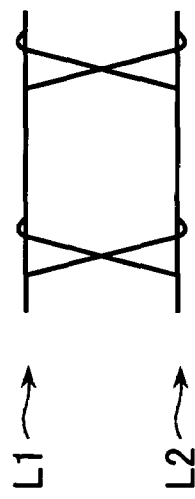
FIGS. 3A to 3C are views showing eye patterns of pulse pattern signals.
Figure 3B:
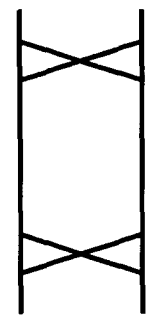
Figure 3C:
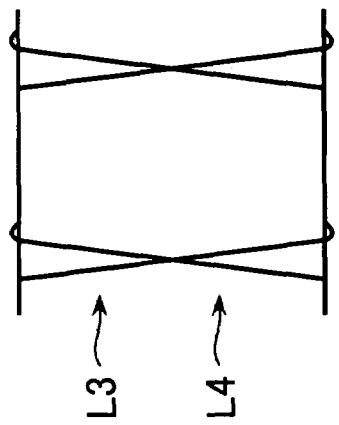
Figure 7:
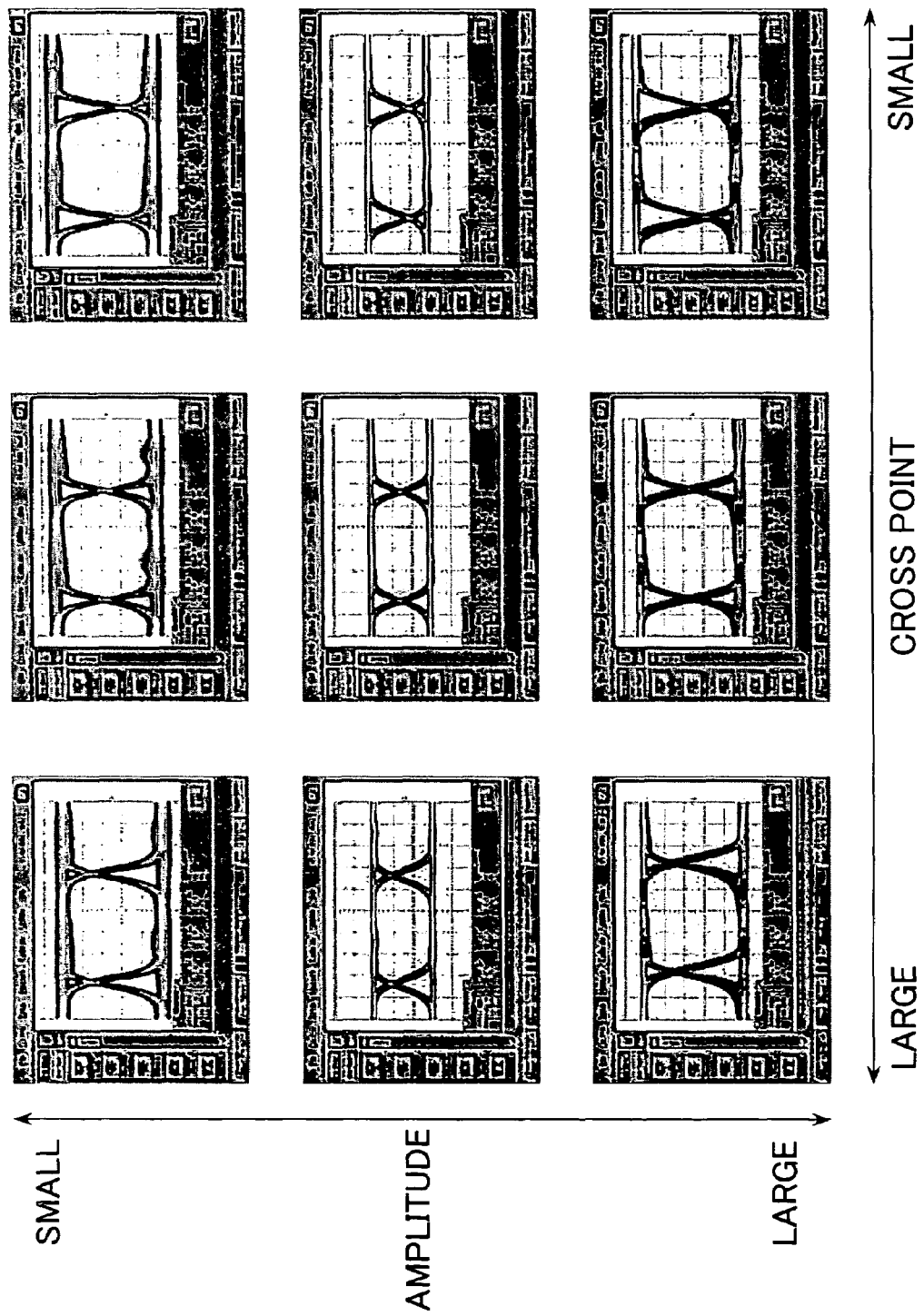
FIG. 7 is a view showing eye patterns of pulse pattern signals outputted from the apparatus shown in FIG. 4.

The operations of the amplifier 25, the upper limit clipping circuit 26 and the lower limit clipping circuit 27 of the waveform generator unit 20 are the same as in the apparatus shown in FIG. 1 and therefore will not be described further in detail. FIG. 7 shows eye patterns of pulse pattern signals outputted from the apparatus shown in FIG. 4. FIG. 7 shows eye patterns outputted while changing parameter values in various manners. It can be seen from FIG. 7 that pulse pattern signals having very high waveform quality equivalent to the waveform quality of the eye pattern shown in FIG. 2 are outputted. The three eye patterns in the upper row in FIG. 7 are displayed as they are enlarged in the direction of amplitude, and their actual amplitude is smaller than the amplitude of the eye patterns in the middle and lower rows.

In this manner, for each eye pattern shape, the output values of the DA converters 21 to 24 are actually measured and stored into the storage unit 40, and the arithmetic operation unit 50 uses the output values in the storage unit 40 to calculate output values that realize an eye pattern shape set by the parameter setting unit 30. On the basis of the result of the calculation, the voltage value setting unit 60 sets the voltage values of the DA converters 21 to 24. This enables output of a pulse pattern signal of high waveform quality even when the eye pattern shape is changed.

This invention is not limited to this structure and may have the following structures.

While the four DA converters 21 to 24 are used in the waveform generator unit 20 in the apparatus of FIG. 4, whatever number of DA converters may be used. Similarly, in addition to the amplifier 25, the upper limit clipping circuit 26 and the lower limit clipping circuit 27, a circuit for generating a pulse pattern signal (for example, a waveform shaping unit, phase shifter or the like) may be provided in the waveform generator unit 20.

In the above-described structure, an electric signal outputted from the waveform generator unit 20 is outputted to the test subject. However, a light beam from a laser diode may be modulated by an electric signal outputted from the waveform generator unit 20, thus converted to an optical signal and then outputted to the test subject.

In the above-described structure, the output values to the DA converters 21 to 24 stored into the storage unit 40 are actually measured values that have been found in advance. However, model values acquired by modeling the waveform generator unit 20 and then performing numerical calculation, or statistical value of actually measured values on plural apparatuses shown in FIG. 4 may be used. In this case, since actual measuring on each apparatus need not be carried out, the time required until storing the output values to the storage unit 40 can be reduced.

While the setting ranges of the parameters are 1 to 5 [V] for amplitude and 30 to 70% for cross point in the above-described structure, whatever setting range may be used.

In the above-described structure, the output values stored into the storage unit 40 are every 0.5 [V] for amplitude and every 5% for cross point. However, whatever interval may be set between the output values and unequal intervals may be used.

Moreover, while amplitude and cross point are used as examples of the parameters for determining the eye pattern shape in the above-described structure, the offset shown in FIG. 2 maybe used as the parameter. In this case, output values corresponding to the offset are stored into the storage unit 40.

This invention has the following effects.

Output values of digital-analog converters for each eye pattern shape are stored into the storage unit. The arithmetic operation unit uses the output values in the storage unit to calculate output values that realize an eye pattern shape set by the parameter setting unit. On the basis of the result of the calculation, the voltage value setting unit sets voltage values of the digital-analog converters. This enables output of a test signal of high waveform quality even when the eye pattern shape is changed.

Since the arithmetic operation unit performs interpolation from the output values in the storage unit and thus calculates the output values corresponding to desired parameter values, a test signal of high waveform quality can be outputted even when the eye pattern shape is changed to a desired shape.

Since the storage unit stores actually measured values on each apparatus as output values, a test signal of higher waveform quality can be outputted even when the eye pattern shape is changed.

Since the storage unit stores model values or statistical values as output values, actual measuring need not carried out on each apparatus. This enables reduction in the time required until storing the output values to the storage unit.

What is claimed is:

1. A pulse pattern generating apparatus that generates a test signal of a predetermined pattern for measuring waveform quality of a digital signal by using plural digital-analog converters and outputs the test signal to a test subject, the apparatus comprising:

a parameter setting unit for setting values of plural parameters that determine the shape of an eye pattern of the test signal;

wherein the parameter setting unit displays a screen where a user can input values via a user interface in order to set and change a cross point position, relative to the rest of the eye pattern, and to set and change an amplitude of the eye pattern;

a storage unit for storing output values to the digital-analog converters corresponding to the values of the parameters within setting ranges in which the values of the parameters are set;

an arithmetic operation unit for calculating output values to the digital-analog converters from the values of the parameters from the parameter setting unit and the output values in the storage unit;

a voltage value setting unit for setting, for the digital-analog converters, voltage values to be outputted from the digital-analog converters on the basis of the result of calculation by the arithmetic operation unit; and wherein the arithmetic operation unit performs interpolation from the output values in the storage unit and thus calculates output values corresponding to the values of the parameters set by the parameter setting unit.

2. The pulse pattern generating apparatus as claimed in claim 1, wherein the test signal is a pseudo-random pattern signal.

3. The pulse pattern generating apparatus as claimed in claim 1, wherein the parameters set by the parameter setting unit are:

a cross point of the eye pattern; and amplitude of the eye pattern.

4. The pulse pattern generating apparatus as claimed in claim 1, wherein the output values to the digital-analog converters stored in the storage unit are actually measured values.

5. The pulse pattern generating apparatus as claimed in claim 1, wherein the output values to the digital-analog converters stored in the storage unit are model values or statistical values.

6. The pulse pattern generating apparatus as claimed in claim 1, wherein the transmission rate of the test signal is higher than 10 [Gbps].

* * * * *